United States Patent [19]
DeShazo

[11] Patent Number: 5,508,551
[45] Date of Patent: Apr. 16, 1996

[54] CURRENT MIRROR WITH SATURATION LIMITING

[75] Inventor: Thomas R. DeShazo, Frenchtown, N.J.

[73] Assignee: Harris Corporation, Melbourne, Fla.

[21] Appl. No.: 204,710

[22] Filed: Mar. 2, 1994

[51] Int. Cl.⁶ .................. H01L 25/07; H01L 25/065; H01L 27/082
[52] U.S. Cl. .................. 257/552; 257/553; 257/561; 257/564
[58] Field of Search .................. 257/560, 561, 257/565, 566, 562, 552, 553, 563, 564

[56] References Cited

U.S. PATENT DOCUMENTS

| | | | |
|---|---|---|---|
| 3,958,267 | 5/1976 | Frederiksen et al. | 257/561 |
| 3,987,477 | 10/1976 | Krolik | 257/561 |
| 4,345,166 | 8/1982 | Allen et al. | 257/566 |
| 4,807,009 | 2/1989 | Fushimi et al. | 257/562 |
| 5,418,386 | 5/1995 | Dos Santos, Jr. et al. | 257/560 |

FOREIGN PATENT DOCUMENTS

| | | | |
|---|---|---|---|
| 0009370 | 1/1983 | Japan | 257/561 |
| 0048970 | 3/1986 | Japan | 257/560 |
| 00107162 | 5/1988 | Japan | 257/560 |

*Primary Examiner*—Peter Toby Brown
*Attorney, Agent, or Firm*—Joel I. Rosenblatt

[57] ABSTRACT

A transistor built on a substrate employs two collectors, an output collector and a secondary collector. The purpose of the secondary collector is to collect minority carriers at saturation and feed these minority carriers back to the input reference of a current mirror. This saturation current causes a decrease in the current through the input reference transistor and decreases the current in the output of the current mirror responsively, driving it away from saturation.

3 Claims, 2 Drawing Sheets

5,508,551

CURRENT MIRROR WITH SATURATION LIMITING

FIELD OF THE INVENTION

This invention relates to a field of integrated circuits. In particular, it relates to the field of integrated circuits mounted on substrates which suffer from substrate injection of minority carriers from current saturation.

BACKGROUND OF THE INVENTION

A bipolar transistor such as a PNP transistor, for example, may be constructed of a P-type emitter located in an N-epi material. Spaced apart from the emitter by the N-epi material may be a P-type collector, with the N-epi material forming a base for the P type collector and P type emitter. The N epi layer is surrounded by a P+ region for isolation to adjacent N epi regions. An N+ buried layer placed below the P+ emitter and collector regions prevents the flow of carriers from the P+ emitter to the P+ region and P substrate due to the creation of a parasitic transistor formed by the P+ emitter material, the N-epi base material and the P substrate material which acts as the collector.

As would be apparent to those skilled in the art, the saturation of bipolar transistors leads to an excess of minority carriers in the base region. These minority carriers flow to the P+ isolation and P substrate regions which are negatively biased, resulting in substrate currents.

This substrate current may be significant resulting in elevated IC temperature due to increased power dissipation. The current can also result in parasitic latch-up conditions. Both are undesirable effects.

SUMMARY OF THE INVENTION

This invention limits the injection of carriers into the substrate by use of a second collector in the output transistor(s) of a current mirror. This second collector is less efficient than the first collector serving as the output collector of the output transistor, due to a wider spacing from the emitter than the output collector. Where the current mirror output collector is not saturated, substantially all of the emitter current from the mirror second transistor substantially flows to the output collector, connected to the output load. This is due to the smaller effective base width of the emitter collector path for the output collector of the mirror's output transistor than is shown for the second collector for the mirror's output transistor.

The output collector of the mirror, as stated above is connected to the output load. The second collector of the output transistor, as stated above, is connected to the base and collector of the current mirror input transistor, which carries the reference current.

By this arrangement, according to the inventive principles, the output collector of the output transistor of the current mirror is prevented from being deeply saturated reducing the accumulation of minority carriers in the base region and reducing parasitic currents through the substrate.

At saturation of the current mirror output transistor, the trapped minority carriers are collected by the second collector which is connected to the base and collector of the current mirror input transistor. This minority carrier flow into the load resistance of the mirror's first transistor reduces the current in the mirror's first transistor. This reduction in the mirror reference current, reduces the current in the output transistor below saturation. This effect reduces the carrier flow in the output transistor, and reduces the accumulation of carriers in the base region and parasitic currents into the substrate.

As carrier injection is reduced, there are fewer carriers which can be collected by the P+ isolation and P substrate layers and ground current is reduced.

In the preferred embodiment, a deep N+ ring is driven to reach the N+ buried layer. This highly doped N+ type material substantially reduces the number of minority carriers which are able to pass from the base region into the P+ isolation and P substrate regions thereby reducing parasitic ground current.

Disclosed is a current mirror. The output transistor of the current mirror is made with two collectors. The current in a transistor is comprised of carriers producing a carrier current. The output transistor of the current mirror has two collectors, a first collector and a second collector. The first collector is located closer to the emitter of the transistor than the second collector and is arranged to collect all of the current carriers up to the maximum current level or saturation current level of that first collector.

The second collector is spaced at a larger distance from the input of the output transistor and is arranged to collect the accumulating current carriers when the first collector is at its saturation level.

The input transistor of the current mirror produces the reference current which controls the current in the output transistor. The input transistor is connected to a load impedance. That load impedance is connected to the carrier current from the second collector of the output transistor. The current within the first transistor output impedance is constant and is the sum of the current mirror reference current and the current from the second collector of the current mirror output transistor. Any increase in the carrier current diverted from the output transistor second collector, decreases the reference current through the input transistor proportionately. In response to this decrease in the input transistor reference current, the current through the second transistor decreases reducing it from the saturation level.

In the preferred embodiment the output transistor is mounted within a P substrate. A N+ buried layer is located next to the P substrate and between the P substrate and the N epi material forming the base of the output transistor. A deep N+ layer extends from the second collector of the transistor to the N+ buried layer and is similarly doped and of the same polarity as the buried layer. The deep N+ layer, contacts the N+ buried layer and forms a well surrounding the transistor and serves to reduce the flow of current from the collectors of the output transistor to the substrate.

DESCRIPTION OF PREFERRED EMBODIMENT

Figure 1A:
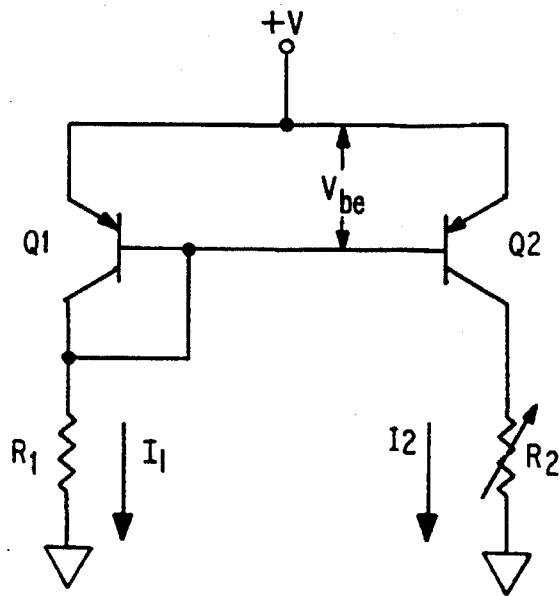
FIG. 1a shows in schematic form, a PNP current mirror configuration, as known in the prior art.

As shown in FIG. 1a, a prior art current mirror uses two transistors connected with emitters and bases in common.

Accordingly, as well known to those skilled in the art, the current I2 in $Q_2$ can be made equal to the current in Q1 or proportional to the current in Q1 depending upon the geometry of the base emitter regions of the transistors.

Current mirrors are well known to those skilled in the art and are not explained for that reason. A full description of current mirrors is provided in *Bipolar and MOS Analog Integrated Circuit Design*, Grebene, A. B., 1984, John Wiley and Sons, New York.

Figure 1B:
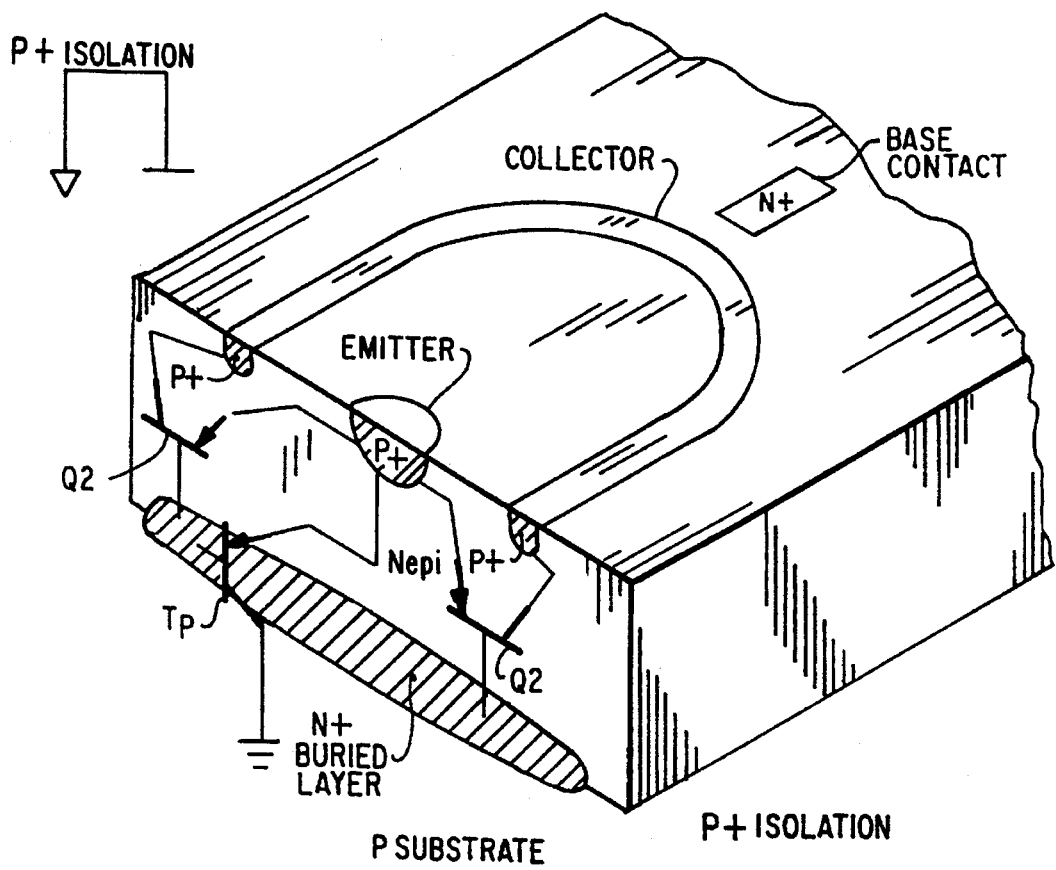
FIG. 1b shows in a sectional view, a transistor, as may be used in a current mirror, made on a semiconductor substrate, according to the prior art.

FIG. 1b shows in cross-sectional view a PNP transistor formed in a semiconductor substrate which could be used as transistor Q2 and representing also a parasitic PNP transistor $T_p$ formed with the semiconductor substrate as a collector.

As known to those skilled in the art, the current I1 through $Q_1$ is a function of the applied voltage (tV), the base to emitter voltage drop of Q1 ($V_{be}$) and the resistance in the collector circuit of Q1, shown as R1.

$$I1 = \frac{+V - VbeQ_1}{R1} \qquad (1)$$

When the geometries of $Q_1$ and $Q_2$ are equal I1 and I2 are equal, unless I2 is limited by $R_2$.

For:

$$I2R2 \leq +V-V_{be} \qquad (2)$$

then Q2 is not saturated and substantially all the emitter current flows to the collector.

For:

$$I2R2 > +V-V_{be}, \text{ then Q2 is in saturation.}$$

FIG. 1b shows in a sectional view, a transistor such as Q2 which may be constructed on a P substrate material. As may be seen in FIG. 1b, in the prior art when transistor Q2 saturates, an excess of minority carriers are injected into the N epi base region where they accumulate and flow to the P+ isolation and P substrate regions as shown in the prior art example.

As shown in the prior art, a parasitic transistor $T_p$ is formed having as its base the N epi region, having as its emitter, the P+ emitter material and as its collector the P+ isolation and P substrate material. As shown, the accumulation of minority carriers in the N epi region, produce emitter collector current in transistor $T_p$, appearing as a parasitic current.

Figure 2A:
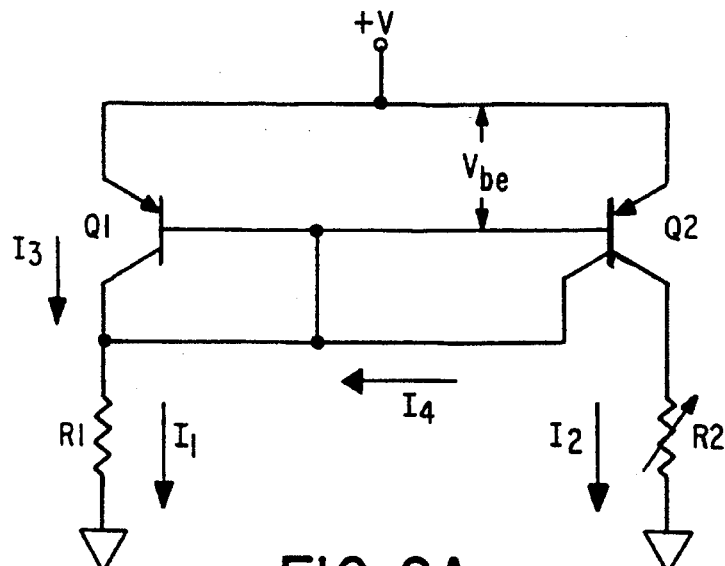
FIG. 2a shows the schematic of the preferred embodiment according to the inventive principles.
Figure 2B:
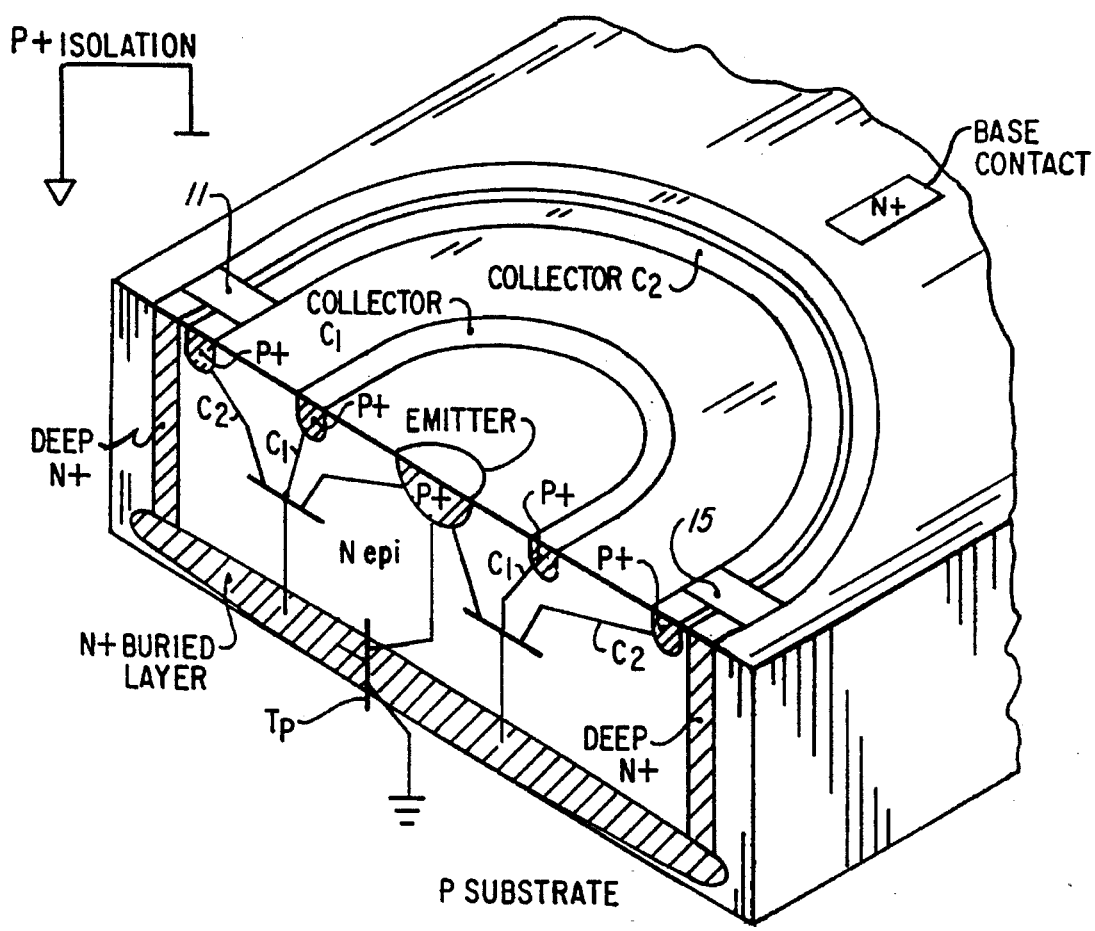
FIG. 2b shows in cross section a transistor as may be used according to the inventive principles in the slave section of a current mirror, having a double collector and connected as shown in the schematic of 2a, to reduce parasitic currents through the semiconductor substrate.

Referring now to FIG. 2a and 2b, the inventive principles as shown in the preferred embodiment, are disclosed.

In FIG. 2 the schematic of a current mirror having two transistors, Q1 and Q2 as shown for the preferred embodiment, and according to the inventive principles.

As can be seen by reference FIG. 2b, second collector C2 of transistor Q2 is at a wider spacing (base width) from the emitter than is the output collector C1 Further as shown the second collector C2 is connected to the base of Q1 and Q2, as shown schematically in FIG. 2a and in FIG. 2b, by connections 11, and 15.

Additionally, as shown in FIG. 2b, a deep N+ layer extends into the base N epi to contact the N+ buried layer.

For $I2R2 < +V-V_{be}$, Q2 is not saturated.

The emitter current of Q2 then flows to the output collector C1 and to the output resistor R2. This is due to the greater efficiency of C1 relative to C2 due to narrow base width of the emitter collector path to collector C1, relative to the wider base width of the emitter collector path of collector C2.

As Q2 conducts more current such that $$I2R2 > +V-V_{be}, \qquad (5)$$

then $Q_2$ becomes saturated and the accumulated minority carriers not collected by the output collector C1 are collected by the second collector C2 connected to the base of Q2 and the base of Q1. The reference current I1 which then flows in resistor R1 is a total of I3, the current flowing from the collector of Q1, and I4, the current flowing from collector C2 of transistor Q2. As I1 is the total of I3 and I4, any increase in I4 due to the current flowing into collector $C_2$ reduces the current through I3 proportionately, as explained below. Since I2 is proportional to the current I3, Current I2 is reduced as I4 increases driving Q2 away from saturation and decreasing the minority carrier injection into the N-epi region.

The voltage across $R_1$ is $+V-V_{beQ_1}$. Accordingly, I1 through R1 is equal to $$\frac{+V - V_{beQ_1}}{R_1} \qquad (6)$$

As the current I1 does not vary due to the series connection of the emitter to base PN junction of Q1, I3 decreases proportionately to any increases in I4. Decreasing I3 produces a parallel current reduction in mirror element Q2, driving Q2 below saturation.

The high concentration N+ material in the deep N+ and N+ buried layers limit the lifetime of the minority carriers from the base region as they travel toward the P+ isolation and P substrate diffusions and the current flow to the ground return path is reduced.

What has been shown and described is a transistor built on a semiconductor substrate having two collectors where a first collector is the output collector and the second collector is a feedback collector to the input transistor of a current mirror. The transistor with two collectors is the output transistor of the current mirror.

The novel arrangement is shown in the preferred embodiment of the two collector transistor arranged in the output of the current mirror with a feedback connection from a second collector to the input transistor of the current mirror which reduces parasitic currents due to the injection of excess minority carriers into the base region at saturation of the output transistor.

As shown above, in FIG. 2a and FIG. 2b, the second collector C2 is arranged with a wider base spacing from the emitter than the first collector C1 serving as an output for the current mirror. This second collect minority carriers not collected by the output collector.

It is the novel arrangement of collector C2 more widely spaced from the emitter than the output collector C1 that creates this efficiency where the minority carriers are directed to the output collector C1 to the output resistor R2 until saturation when collector C2 collects minority carriers. The addition of the deep N+ diffusion makes collection by C2 more efficient than by the p isolation and substrate diffusions.

The current I4 within the second collector C2 of the current mirror output transistor Q2 is then provided as a current to the output load resistance of the primary transistor Q1 of the current mirror. As well known by those skilled in the art, where the two transistors are connected with common base and emitter connections, the current through the collectors will be substantially the same, all other elements being equal. Accordingly at saturation the minority carriers, collected by the second collector and fed back to the input transistor in the current mirror, reduces the reference current I1 and reduces the output current I2 driving Q2 away from saturation and towards linear operation. This produces a suitable reduction in current below saturation removing the minority carriers which would not be collected by the output collector of the current mirror secondary and would otherwise accumulate in the N epi base region. The N+ Buried layer and Deep N+ regions serve to absorb excess minority carriers from the base region and reduce the current flow to the substrate and isolation regions which they would otherwise cause.

The inventive principles, as disclosed in the preferred embodiment, are not limited to PNP bipolar transistors, but may be applied to other devices in which saturation current can be reduced by collecting the uncollected carriers produced at saturation.

In the preferred embodiment, at current levels below saturation occurring at the maximum carrier current level, some current shown as I4 will flow. At saturation, where the carrier current through collector C1 reaches a maximum, some of the excess carriers produced at saturation will flow in the parasitic transistor $T_p$ as shown in FIG. 2b, formed between the emitter, the N epi base material and the P substrate serving as a collector of the parasitic transistor. This current will be produced as a parasitic current and produce the degenerative effect of heating. Accordingly, as would be understood by those skilled in the art, substantially all of the excess current carriers is represented as current I4, some of the excess current produced when collector 1 is at saturation and at its maximum current level, flows through the parasitic transistor $T_p$. The presence of the buried layer N+ and the deep N+ layer reduced the life of these current carriers and reduces the parasitic transistor current flow.

As would be understood by those skilled in the art, at current levels in Q2 less than the maximum current level or saturation of collector C1, some negligible current I4 will be present flowing to the load resistance R1.

I claim:

1. A current mirror with saturating current limiting, comprising:

a current mirror having a first transistor and a second transistor;

said second transistor having an emitter and first and second collectors;

said first collector arranged at a first distance from said emitter and said second collector arranged at a second distance from said emitter;

said second distance is larger than said first distance;

said emitter is a first conductivity type material;

said emitter is located in a second conductivity type material of opposite polarity to said first conductivity type material and forming the base of said second transistor;

said second transistor is mounted in a substrate of said first conductivity type material;

said first collector of said second transistor is arranged to pass carrier current to the output of said second transistor up to a maximum current carrier level indicative of a saturation current level;

said second collector of said second transistor, is arranged to pass carrier current accumulated at said first collector when said first collector is at saturation;

said first transistor generating a reference current controlling the carrier current of said second transistor;

said first transistor connected at a first terminal to an impedance and at a second terminal to a voltage source;

said impedance connected to receive said reference current from said first transistor and said carrier current from said second collector of said second transistor;

said reference current is at a first level in the absence of said carrier current from said second collector of said second transistor;

said reference current is reduced relative to said first level in response to said voltage source and said carrier current from said second collector of said second transistor and said carrier current in said second transistor is reduced in response to said reduced reference current.

2. The current mirror of claim 1, wherein a well of said second conductivity type material located around said second transistor and arranged to limit the life of current carriers from said base of said second transistor to said substrate;

said well is arranged to absorb excess current carriers from said base of said second transistor to reduce the flow of current carriers to said substrate.

3. The current mirror of claim 2, wherein said well includes a buried layer between said second transistor and said substrate and a deep layer surrounding said second transistor.

* * * * *